(12) United States Patent
Walther (10) Patent No.: US 8,488,105 B2
(45) Date of Patent: Jul. 16, 2013

(54) MULTI-TABLE LITHOGRAPHIC SYSTEMS, LITHOGRAPHY PROCESSING TOOLS AND METHODS FOR PROCESSING WORKPIECES

(75) Inventor: Jonas Walther, Solna (SE)

(73) Assignee: Micronic Mydata AB, Taby (SE)

( * ) Notice: Subject to any disclaimer, the term of this patent is extended or adjusted under 35 U.S.C. 154(b) by 664 days.

(21) Appl. No.: 12/704,046

(22) Filed: Feb. 11, 2010

(65) Prior Publication Data
US 2010/0214552 A1    Aug. 26, 2010

Related U.S. Application Data

(60) Provisional application No. 61/202,289, filed on Feb. 13, 2009.

(51) Int. Cl.
*G03B 27/58* (2006.01)
*G03B 27/42* (2006.01)

(52) U.S. Cl.
USPC ................................. 355/72; 355/53

(58) Field of Classification Search
USPC ................................. 355/53, 72, 75
See application file for complete search history.

(56) References Cited

U.S. PATENT DOCUMENTS
2004/0197184 A1   10/2004  Sugiyama et al.
2005/0002006 A1    1/2005  Fukui

OTHER PUBLICATIONS
International Preliminary Report on Patentability dated May 5, 2011 issued in corresponding International Application No. PCT/EP2010/051742.

*Primary Examiner* — Peter B Kim
(74) *Attorney, Agent, or Firm* — Harness, Dickey & Pierce, P.L.C.

(57) ABSTRACT

A lithographic workpiece processing tool includes a loading area for loading a workpiece; and a processing area for processing a workpiece. The workpiece processing tool further includes a multi-table system arranged between the loading area and the processing area. The multi-table system includes at least two tables configured to pass each other while moving between the loading area and the processing area. Each of the at least two tables is configured to hold a workpiece.

18 Claims, 9 Drawing Sheets

MULTI-TABLE LITHOGRAPHIC SYSTEMS, LITHOGRAPHY PROCESSING TOOLS AND METHODS FOR PROCESSING WORKPIECES

CROSS-REFERENCE TO RELATED APPLICATIONS

This patent application claims priority to provisional U.S. patent application No. 61/202,289, filed on Feb. 13, 2009, the entire contents of which is incorporated herein by reference.

BACKGROUND

Description of Conventional Art

In a conventional device for writing or patterning a workpiece (e.g., a substrate or wafer), the work flow usually includes at least four process steps: load, measure, write and unload. If these process steps are performed serially, idle time for system resources exists resulting in relatively low throughput.

In order to improve system resource utilization, a pipelined architecture may be used. A device having multiple substrate carrying tables enables parallel activities and reduces the idle time for system resources. In one example device, two tables are arranged on a single prismatic axis such that the tables enter a writing area from opposite ends. Such an arrangement, however, requires duplicate loading and alignment systems and areas.

SUMMARY

Example embodiments provide multi-table systems in which tables may pass each other when moving between a loading area and a processing area. Such an example embodiment requires only a single loading area and a single processing area.

At least one example embodiment provides a lithography processing tool. The tool includes: a loading area for loading a workpiece; a processing area for processing a workpiece; and a multi-table system arranged between the loading area and the processing area. The multi-table system includes at least two tables configured to pass each other while moving between the loading area and the processing area. Each of the at least two tables is configured to hold a workpiece.

According to at least some example embodiments, each of the at least two tables may be configured to pass above or below another of the at least two tables.

According to at least some example embodiments, each of the at least two tables may be configured to be at least one of raised and lowered such that the at least two tables pass each other when moving between the loading area and the processing area.

Each of the at least two tables may be mounted on a bearing. The bearing provides prismatic movement along a shaft and rotational movement around an axis. The tool may be a pattern generator, a measurement tool, an inspection tool, a scanning multi-beam system, or an optical processing device including one or more rotating optical arms, which include optics configured to relay image information from a modulator to the surface of the workpiece.

BRIEF DESCRIPTION OF THE DRAWINGS

Example embodiments will be discussed in more detail with regard to the drawings in which.

DETAILED DESCRIPTION

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only the example embodiments set forth herein.

It should be understood, however, that there is no intent to limit example embodiments to the particular ones disclosed, but on the contrary example embodiments are to cover all modifications, equivalents, and alternatives falling within the appropriate scope. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments relate to scanning of workpieces, such as a substrate or wafer, for reading and writing patterns and/or images. Example embodiments also relate to measuring workpieces. Example substrates or wafers include flat panel displays, printed circuit boards (PCBs), substrates or workpieces for packaging applications, photovoltaic panels, and the like.

According to example embodiments, reading and writing are to be understood in a broad sense. For example, reading operations may include microscopy, inspection, metrology, spectroscopy, interferometry, scatterometry, etc. of a relatively small or relatively large workpiece. Writing may include exposing a photoresist, annealing by optical heating, ablating, creating any other change to the surface by an optical beam, etc.

Multi-table systems according to example embodiments may be implemented in (or in conjunction with) pattern generators (or other tools) for writing an image on a substrate, for example, a pattern generator comprising one or a plurality of image-generating modulators.

Multi-table systems according to example embodiments may be implemented in (or in conjunction with) measurement and/or inspection tools for measuring a workpiece. A measurement and/or inspection tool in which where one or more example embodiments may be implemented may comprise one or a plurality of detectors, sensors (e.g., time delay and integration (TDI) sensors), cameras (e.g., charged coupled devices (CCDs)), or the like.

Example embodiments may also be implemented in pattern generators for writing patterns on a relatively thick substrate such as a three-dimensional (3D) substrate or may be implemented in a tool for measuring or inspecting a relatively thick workpiece or substrate (e.g., a tool for measuring or inspecting a three-dimensional (3D) pattern in a photoresist thicker than between about 2 µm and about 100 µm or more).

Example embodiments may also be implemented in a scanning multi-beam system such as an acousto-optic multi-beam system comprising at least one deflector.

Still further, example embodiments may be implemented in a relatively high throughput optical processing device including one or more rotating optical arms having optics that relay image information from a modulator to the surface of the workpiece while maintaining an essentially consistent orientation relationship between information on the workpiece and information at the hub of the rotating optical arm, even as the arm sweeps an arc across the workpiece.

Example embodiments may also be implemented in a measurement and/or inspection tool including one or more rotating arms comprising one or a plurality of detector sensors.

Example embodiments provide a system in which tables may pass each other while moving between a loading area and a processing area. According to at least some example embodiments, the processing area may be a reading area, a writing area and/or a measuring area.

Example embodiments provide multi-table systems in which tables may pass each other when moving between a loading area and a processing area. Such an example embodiment requires only a single loading area and a single processing area.

At least one example embodiment provides a lithography processing tool. According to at least this example embodiment, the tool includes: a loading area for loading a workpiece; a processing area for processing a workpiece; and a multi-table system arranged between the loading area and the processing area. The multi-table system includes at least two tables configured to pass each other while moving between the loading area and the processing area. Each of the at least two tables is configured to hold a workpiece.

According to at least some example embodiments, each of the at least two tables may be configured to be at least one of raised and lowered such that the at least two tables pass each other when moving between the loading area and the processing area.

Each of the at least two tables may be mounted on a bearing. The bearing provides prismatic movement along a shaft and rotational movement around an axis. The tool may be a pattern generator, a measurement tool, an inspection tool, a scanning multi-beam system, or an optical processing device including one or more rotating optical arms, which include optics configured to relay image information from a modulator to the surface of the workpiece.

According to at least some example embodiments, each of the at least two tables may be configured to pass above or below another of the at least two tables.

According to at least some example embodiments, the tool may further be configured to lift a first of the at least two tables such that a second of the at least two tables passes below the first table.

According to at least some example embodiments, the tool may further include at least a first mechanical hand configured to lift a first of the at least two tables such that a second of the at least two tables passes below the first table.

The multi-table system further includes: a first table assembly and a second table assembly. The first table assembly includes a first of the at least two tables, and the first table assembly is configured to move between the loading area and the processing area. The second table assembly includes a second of the at least two tables, and the second table assembly is configured to move between the loading area and the processing area. The first table is mounted on a first supporting part, the second table is mounted on a second supporting part, and the first table is configured to be raised or lowered via an actuator such that the first table passes above the second table when moving between the loading area and the processing area.

The supporting part of the first table assembly and the supporting part of the second assembly table may pass one another at a same or substantially the same vertical height when moving between the loading area and the processing area.

According to at least some example embodiments, a first of the at least two tables is mounted on a first vertically actuatable shaft and a second of the at least two tables is mounted on a second vertically actuatable shaft. The first and second tables are configured to be raised and lowered such that one of the first and second tables passes below another of the first and second tables when moving between the loading area and the processing area.

According to at least some example embodiments, a first of the at least two tables is smaller than a second of the at least two tables and the first table is configured to pass below the second table when moving between the loading area and the processing area.

At least one other example embodiment provides a method for processing a workpiece for lithography applications. According to at least this example embodiment, a first workpiece is loaded on a first of at least two tables, and the first table is moved to a processing area. The first workpiece is processed, and a second workpiece is loaded on a second of the at least two tables. In certain example embodiments, a time during which the first workpiece is processed at least partially overlaps a time during which the second workpiece is loaded. This enables production at a higher rate than in state of the art single table systems.

State of the art multiple table systems often suffer from non-uniform piece flow and a poor interface to other systems in a production line. The symmetric dual table design of example embodiments solves or mitigates the above problems by providing essentially parallel shafts and a linear motor rail and/or a linear scale that are shared between a plurality of tables, thereby enabling processing of workpieces at an even pace that also facilitates the interface to other systems in a production line.

According to at least some example embodiments, when moving to the processing area, the first table passes above or below the second table.

According to at least some example embodiments, the second table may be moved to the processing area, and the first table may be moved back to the loading area. As the first and second tables pass one another, at least one side of at least one of the tables is raised or lowered to enable the passing of the tables.

At least one other example embodiment provides a pattern generator. The pattern generator includes a pattern generating unit configured to generate a pattern on a workpiece, and a table system configured to move workpieces to and from the pattern generating unit. The table system includes at least two tables mounted on respective shafts extending between a loading area and the pattern generating unit. Each of the at least two tables is configured to carry a workpiece, and configured to pivot along an axis of a respective one of the shafts such that a first of the at least two tables passes above or below a second of the at least two tables.

Figure 1:
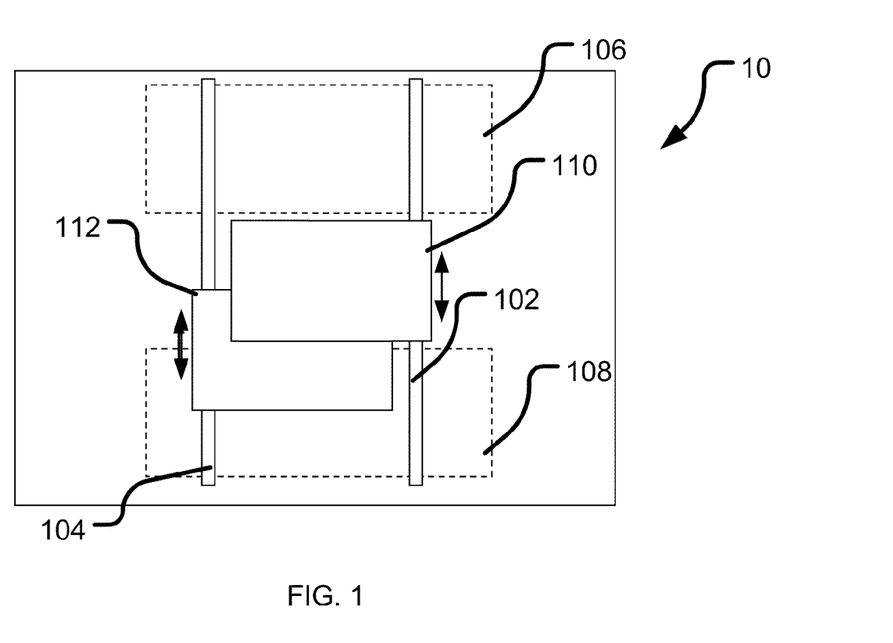
FIG. 1 illustrates a multi-table system according to an example embodiment.

FIG. 1 is a top view of a multi-table system according to an example embodiment.

According to at least one example embodiment, the multi-table system may also be referred to as a pattern generator.

Referring to FIG. 1, the multi-table system 10 includes a loading area 108 and a processing area 106. Table 110 is mounted on shaft or rail 102, and table 112 is mounted on shaft or rail 104. The shafts 102 and 104 extend at least between and through the loading area 108 and the processing area 106. Tables 110 and 112 are configured to move concurrently or simultaneously between the loading area 108 and the processing area 106 on the shafts 102 and 104. In one example, the shafts 102 and 104 may be magnetic rails, and tables 110 and 112 may be driven by a linear motor (not shown).

Although not shown in FIG. 1, the tables 110 and 112 may share the same linear motor or even the same shaft or rail. Thus, in certain example embodiments, the tables 110 and 112 may be driven by a common linear motor (not shown) and in yet another example embodiment, the tables 110 and 112 may then share the same linear motor and magnetic rail. By sharing a common linear motor between tables in a multiple table system according to example embodiments, the overall total cost of the system may be significantly reduced compared to systems with multiple magnetic rails. The use of a single common magnetic rail for a multiple table system also reduces assembly time.

High precision systems that require very accurate velocity control may need to measure and compensate for force variations along each magnetic rail. Introducing a common rail for the tables according to example embodiments provides for an accurate velocity control in a high precision system and/or may reduce the need for accurate velocity control and calibration.

In example operation, one of tables 110 and 112 passes above or below the other when moving between the loading area 108 and the processing area 106.

At the loading area 108, workpieces are loaded and unloaded. At the processing area 106, workpieces are processed. The processing area 106 may be a reading area, a writing area and/or a measuring area. In one example, the processing area 106 may include a processing unit or tool (e.g., a reading unit, writing unit and/or measuring unit) configured to process workpieces loaded on tables 110 and 112. For example, the processing area 106 may include one or more of: a pattern generating tool; a measurement tool; an inspection tool; an acousto-optic multi-beam pattern generating apparatus; and a relatively high throughput optical processing device.

According to at least some example embodiments, a time during which a workpiece on a first table (e.g., table 110) is processed at least partially overlaps a time during which a workpiece is loaded on a second table (e.g., table 112).

Still referring to FIG. 1, when tables 110 and 112 are able to pass one another, the same loading system, alignment system and/or processing system may be used for workpieces arranged on both tables 110 and 112. Accordingly, the total throughput may be increased, while costs and/or space requirements for the overall system may be reduced.

Figure 2:
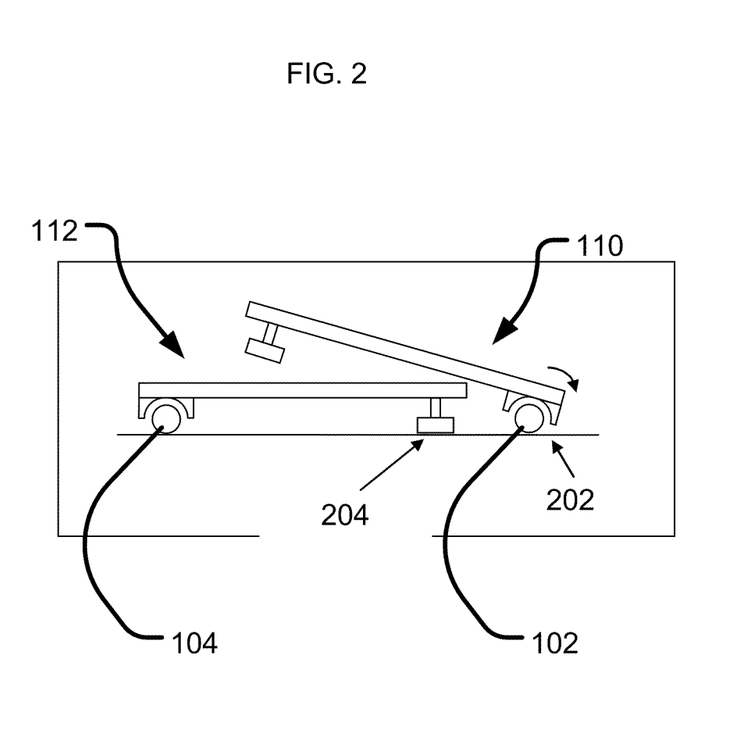
FIG. 2 illustrates a portion of a multi-table system according to an example embodiment.
Figure 3:
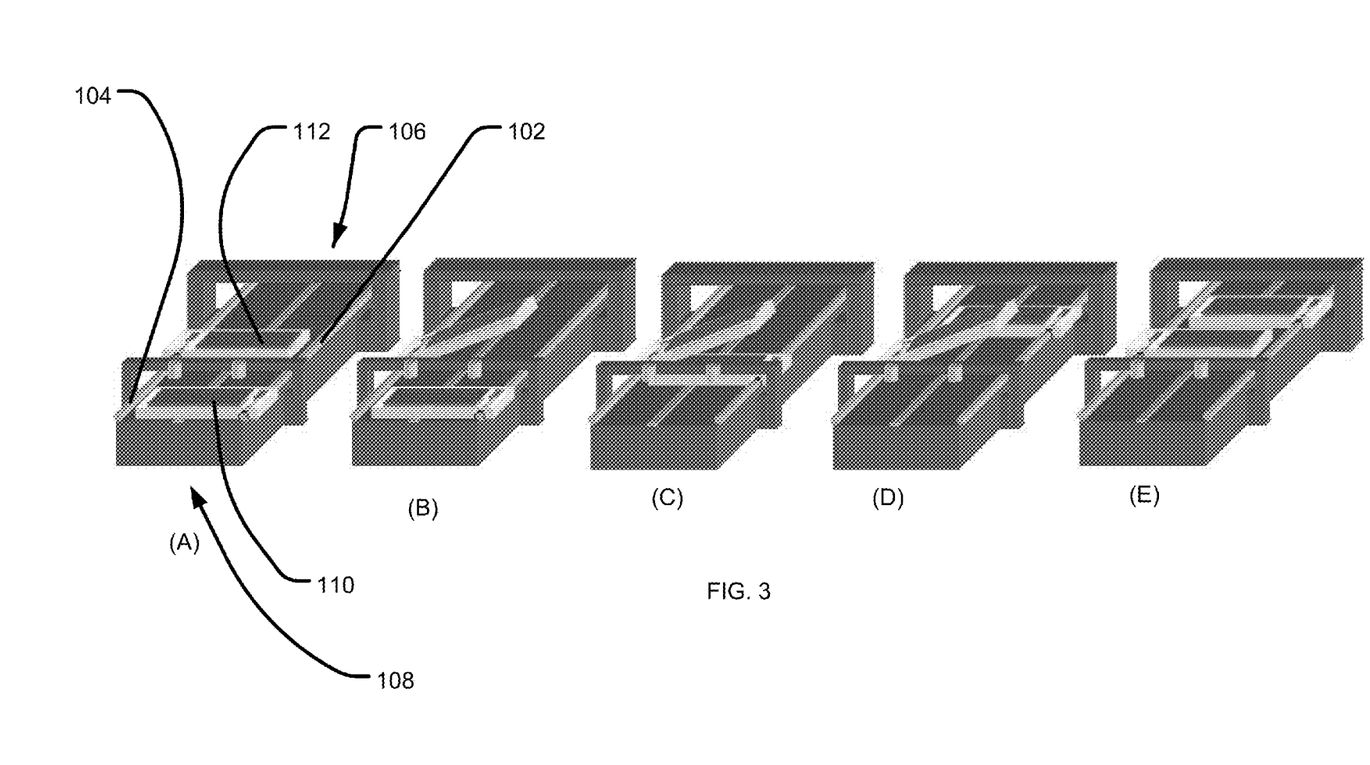
FIGS. 3A-3E illustrate an example operation of a multi-table system according to an example embodiment.
Figure 4:
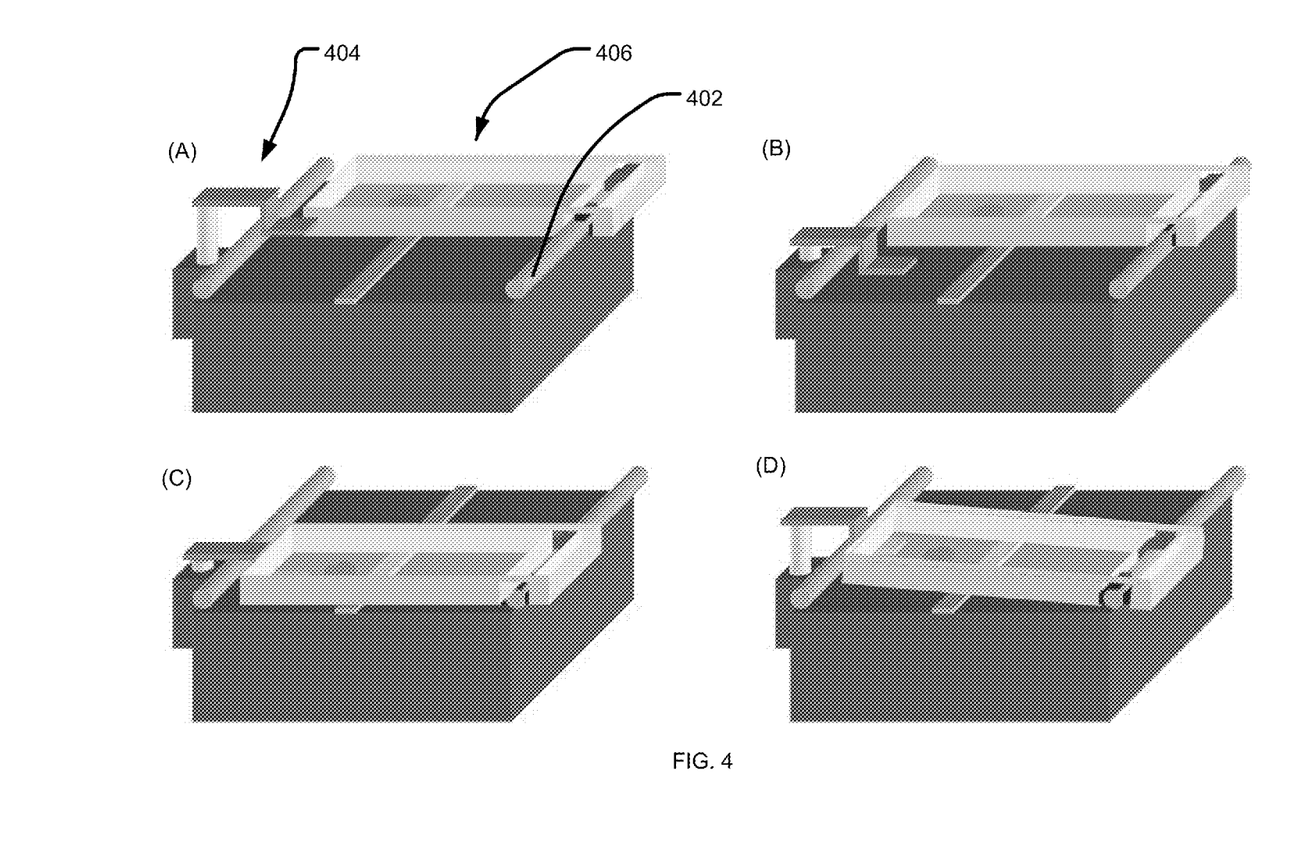
FIG. 4 illustrate an example operation of a multi-table system according to another example embodiment.

FIG. 2 illustrates a portion of a multi-table system according to an example embodiment. The portion of the multi-table system shown in FIG. 2 illustrates an example manner in which tables 110 and 112 pass one another.

Referring to FIG. 2, table 110 is mounted on shaft 102 via a pivot bearing 202 with at least two degrees of freedom. Table 110 is also mounted on a vertical bearing 204. Table 112 is mounted on shaft 104 via a pivot bearing 202 with at least two degrees of freedom. Table 112 is also mounted on a vertical bearing 204. Although FIG. 2 shows both tables 110 and 112 mounted on bearings, only one of tables 110 and 112 may be mounted on the pivot bearing 202. The bearings 202 and 204 provide for prismatic movement of tables 110 and 112 along shafts 102 and 104, and rotational movement of tables 110 and 112 around the shafts 102 and 104 as a rotational axis. The pivot bearings 202 having two degrees of freedom may be, for example, radial air bearings, air bushings, magnetic bearings, ball bearings or any other kind of bearings capable of providing prismatic and rotational freedom.

Using the rotational freedom provided by the pivot bearings 202, table 110 may be lifted such that table 112 passes below table 110 when tables 110 and 112 pass one another between a loading area and a processing area. Although not shown in FIG. 2, the rotational freedom may also be used to lower one of the tables (e.g., table 112) while the other table (e.g., table 110) passes above the lowered table.

According to at least one example embodiment, tables 110 and 112 may carry substrates or wafers at the same or substantially the same vertical height at all times except when passing one another.

Multi-table systems according to example embodiments may be built with little or no moving parts. In addition, a table may have a kinematic bearing design with at least three supporting points that span a single plane, which may simplify assembly and/or adjustment of the multi-table system. Further, as discussed above, if tables according to example embodiments are designed to be driven by a linear motor, the tables may share the same magnetic rail. Further still, if table position is measured with a linear encoder, the tables may also share the same linear scale. One common linear scale for multiple tables reduces cost, simplifies assembly and reduces (e.g., minimizes) the work required for alignment. Furthermore one scale for multiple tables will reduce (e.g., minimize) position deviations between the tables. This facilitates processing with repeatable results regardless of which of the tables is being used. Obtaining repeatable results is particularly important for batch processing where overlay between each processed workpiece is a crucial factor. A single linear scale also enables easier protection and cleaning because linear scales are usually sensitive to particles and contamination. According to at least one example embodiment, the motor and/or scale may be positioned relatively close to the center of rotation of the tables, which may reduce and/or minimize parasitic rotation.

FIGS. 3A-3E show a sequence illustrating an example operation in which table 110 passes beneath table 112 when moving from the loading area 108 and the processing area 106.

As shown in FIG. 3A, each of tables 110 and 112 are initially positioned at the same or substantially the same vertical height.

Referring to FIGS. 3B and 3C, as table 110 moves toward the processing area 106 and approaches table 112, table 112 is lifted such that table 110 passes beneath table 112. In this example, table 112 pivots on the shaft 104 such that table 112 rotates around the shaft 104 and a side of table 112 is lifted.

Referring to FIGS. 3C and 3D, after table 112 is lifted, table 110 passes under table 112.

Referring to FIG. 3E, after table 110 passes under table 112, table 112 is lowered back to its original position and continues moving toward the processing area 106.

The example embodiment shown in FIGS. 3A-3E enables loading, unloading, and measuring of a workpiece in parallel with the processing of another workpiece.

According to at least some example embodiments, system resources are idle only while the tables move between the loading area and processing area or vice versa.

According to at least one example embodiment, the lifting motion of the tables may be generated by a mechanical hand or a magnetic actuator at a free end of the table (e.g., opposite to the side at which the table is mounted to the shaft) or by an electromagnetic device configured to generate a torque around the shaft.

FIGS. 4A-4D show a sequence illustrating an example embodiment in which a mechanical hand lifts a side of a table. In this example embodiment, table 406 is mounted on shaft 402 such that table 406 pivots on the shaft 402 and a side of table 406 is capable of being lifted by a mechanical hand 404. The mechanical hand 404 is configured to be raised and lowered to lift and lower table 406.

Referring to FIG. 4A, the mechanical hand 404 is mounted at a free end of table 406. In this example, the mechanical hand 404 is mounted at the side opposite to the shaft 402, and positioned in an up-position such that the lower portion of the mechanical hand 404 is above the upper surface of table 406.

Referring to FIG. 4B, as table 406 approaches the mechanical hand 404, the mechanical hand 404 is lowered into a down position such that an upper surface of a lift portion of the mechanical hand 404 is below the lower surface of table 406.

Referring to FIG. 4C, once in the down position, table 406 passes above the lift portion of the mechanical hand 404.

Referring to FIG. 4D, the mechanical hand 404 is then moved into the up position to lift a side of table 406 such that another table (not shown) can pass beneath table 406.

As described in more detail below, other possible design choices may be used to enable at least two tables to pass at different vertical levels while keeping the tables at the same or substantially the same vertical height at other times.

Figure 5:
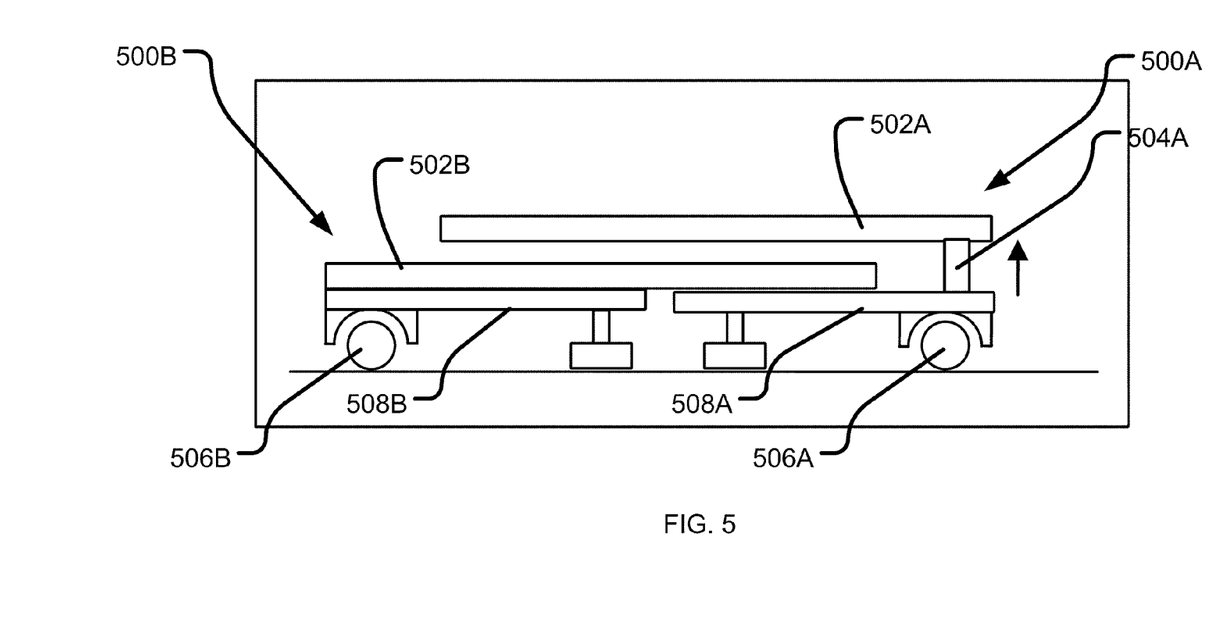
FIG. 5 illustrates a portion of a multi-table system according to another example embodiment.

FIG. 5 illustrates a portion of a multi-table system according to another example embodiment.

As shown in FIG. 5, table assemblies 500A and 500B include multiple parts. In this example, at least one part of one table assembly may be raised or lowered.

Referring to FIG. 5, table assembly 500A is mounted on a shaft 506A such that the table assembly 500A is capable of prismatic movement along the shaft 506A. Table assembly 500B is mounted on shaft 506B such that the table assembly 500B is capable of prismatic movement along the shaft 506B.

Table assembly 500A includes a table 502A mounted on a supporting part 508A. Table assembly 500B includes a table 502B mounted on a supporting part 508B. Each of the supporting parts 508A and 508B are arranged at the same or substantially the same vertical height, and arranged to pass one another when moving between a loading area and a processing area or vice versa.

In the example embodiment shown in FIG. 5, the tables 502A and 502B are larger (e.g., at least in the horizontal direction) than the supporting parts 508A and 508B.

The tables 502A and 502B may be positioned at the same vertical height until passing one another. In this example, as the table assemblies 500A and 500B approach one another, table 502A is raised by an actuator 504A such that table 502A passes above table 502B.

Although not shown in FIG. 5, table assembly 500B may also include an actuator such that table 502B may be raised or lowered in the same or substantially the same manner as the table 502A.

Figure 6:
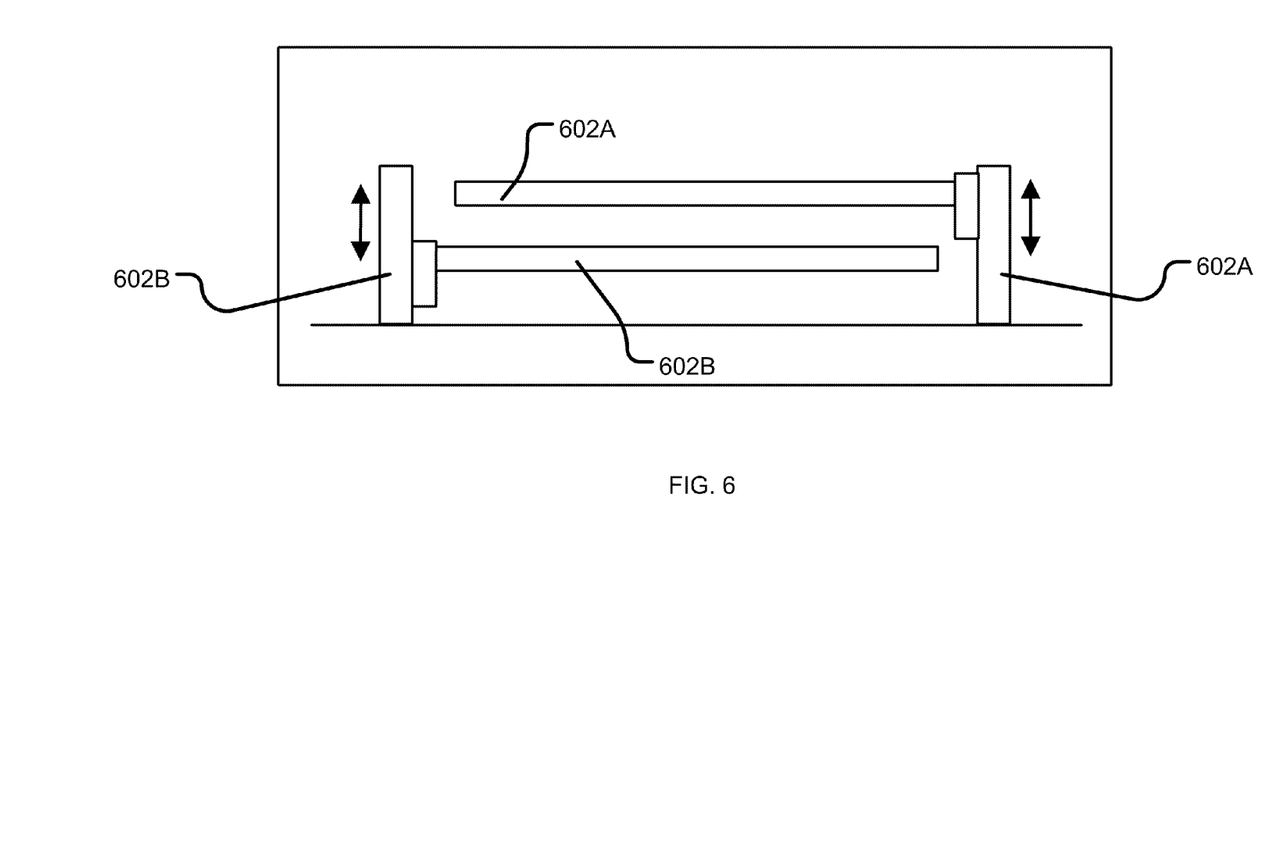
FIG. 6 illustrates a portion of a multi-table system according to yet another example embodiment.

FIG. 6 illustrates a multi-table system according to yet another example embodiment.

Referring to FIG. 6, a table 600A is fixed to a vertically actuatable shaft 602A at one side. Table 600B is also fixed to a vertically actuatable shaft 602B at one side. The vertically actuatable shafts 602A and 602B are arranged at opposite sides, such that ends of the tables 600A and 600B, which are not attached to the vertically actuatable shafts 602A and 602B, face one another.

In the example embodiment shown in FIG. 6, the tables 600A and 600B may be raised and lowered to discrete positions (or continuously) such that tables 600A and 600B are able to pass one another when moving between a loading area and a processing area or vice versa.

According to example embodiments, one of tables 600A and 600B may be smaller than the other. In one example, the smaller table may be raised during processing and/or alignment.

Figure 7:
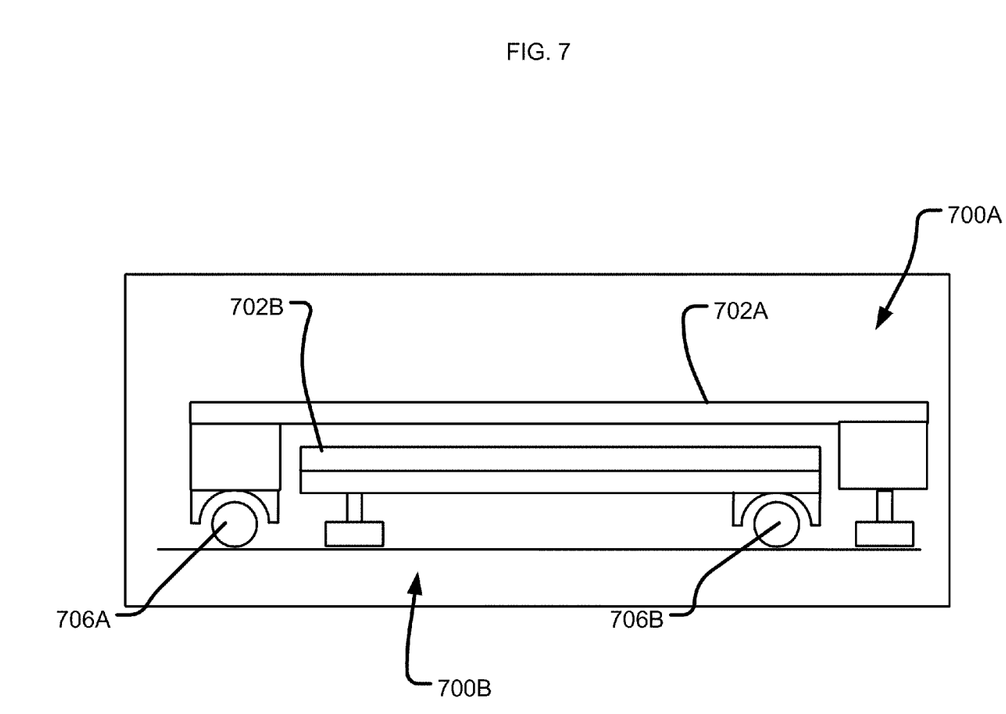
FIG. 7 illustrates a portion of a multi-table system according to still another example embodiment.

FIG. 7 illustrates a multi-table system according to still another example embodiment.

As shown in FIG. 7, table assembly 700B includes a table 702B, which is smaller than table 702A of table assembly 700A. In this example, the larger table 702A may be raised such that the smaller table 702B passes under the larger table 702A when moving between a loading area and a processing area or vice versa.

Referring to FIG. 7 in more detail, table assembly 700A is mounted on a shaft 706A such that the table assembly 700A is capable of prismatic movement between a loading area and a processing area. Table assembly 700B is mounted on shaft 706B such that the table assembly 700B is capable of prismatic movement between the loading area and the processing area.

The tables 702A and 702B may be positioned at the same or substantially the same vertical height until passing one another. Alternatively, the tables 702A and 702B may be positioned at different vertical heights. In one example, the smaller table 702B may be positioned at a lower vertical height relative to the larger table 702A such that the smaller table 702B may pass below the larger table 702A.

In an example in which tables 702A and 702B are positioned at the same or substantially the same vertical height until passing one another, as the table assemblies 700A and 700B approach one another, table 702A is raised by an actuator (not shown) arranged at a side of the table assembly 500A such that the larger table 702A passes above the smaller table 702B.

Throughput systems according to example embodiments may use linear encoders for position measurement. Linear encoders may have a bandwidth limitation that forces a trade-off between velocity and resolution. In a relatively high throughput system, it may be beneficial to perform transport movements at a relatively high velocity and/or to use a relatively high resolution during writing and/or alignment. This may be accomplished by using two or more encoder read heads per table and combining the outputs of the two encoders as shown in FIG. 8.

Figure 8:
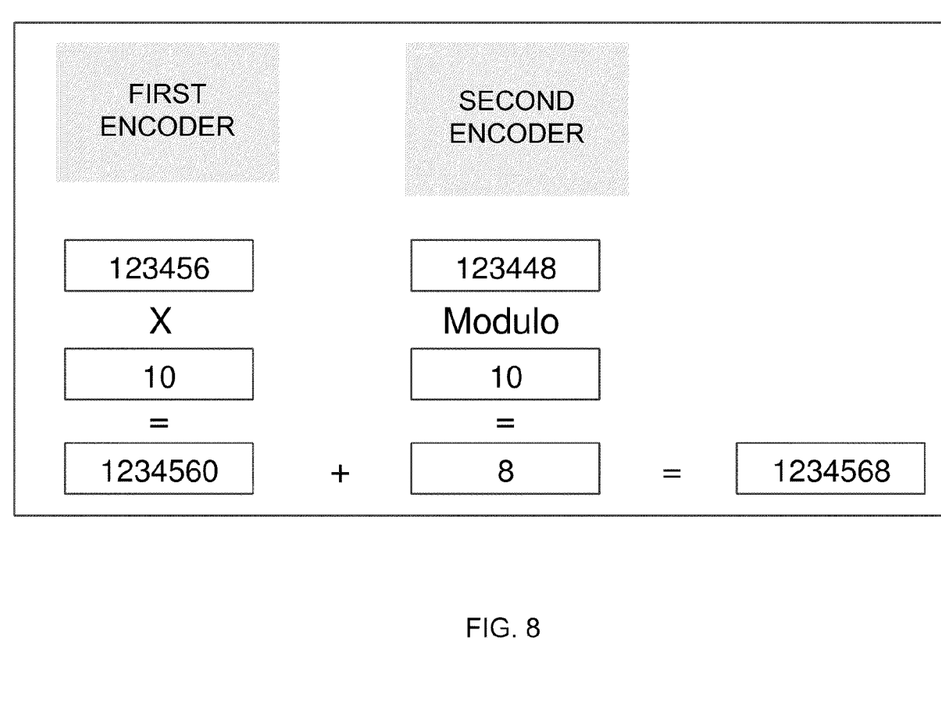
FIG. 8 illustrates an example embodiment of a method for combining encoder outputs.

FIG. 8 illustrates an example embodiment of a method for combining encoder outputs.

Referring to FIG. 8, a first encoder is configured for relatively high velocity (e.g., a maximum velocity of about 2.5 m/s) and relatively low resolution (e.g., about 50 nm), whereas a second encoder is configured for relatively low velocity (e.g., a minimum velocity of about 0.25 m/s) and relatively high resolution (e.g., about 5 nm). The first encoder is capable of interpolating by about 400×, whereas second encoder is capable of interpolating by about 4000×.

The absolute position is then given by the first encoder, and an extra high resolution digit may be added from the second encoder resulting in a relatively high resolution position that may have errors in the last digit during relatively high velocity movements, but is accurate during relatively low velocity movements.

The encoder system according to at least this example embodiment may be used for other systems, stage solutions and/or moving objects that use an encoder and a relatively high velocity—relatively low resolution mode in combination with a relatively low velocity—relatively high resolution mode.

Figure 9:
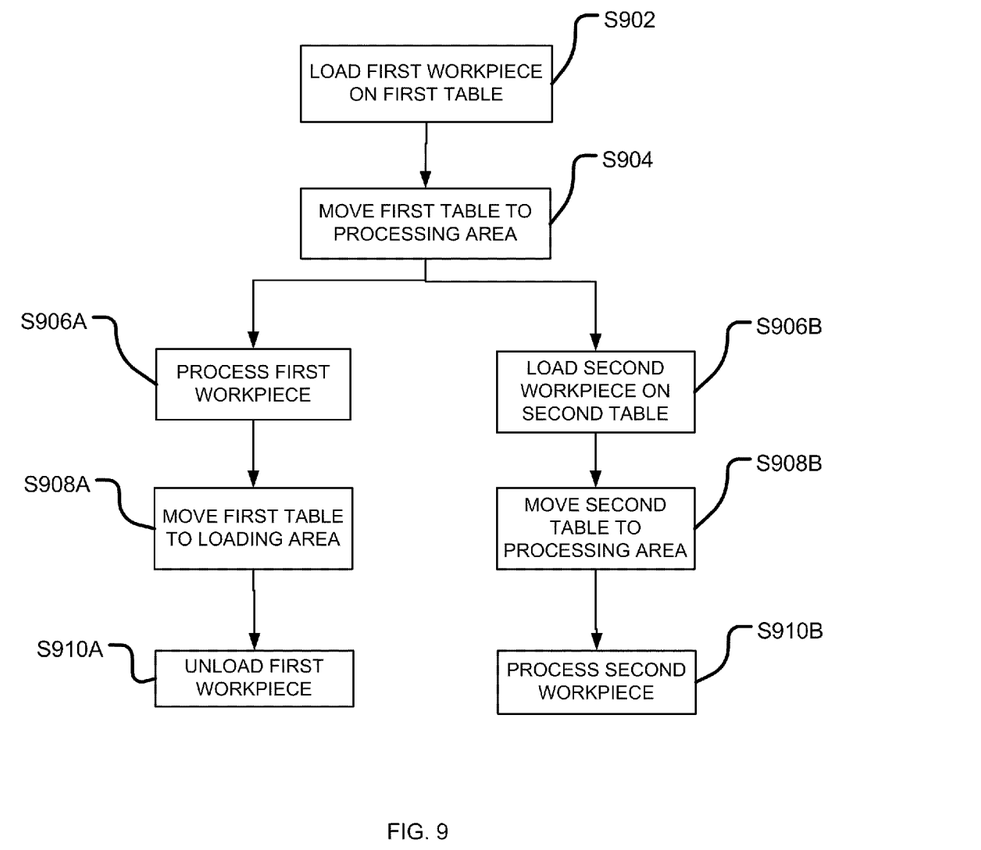
FIG. 9 is a flow chart illustrating a method for processing workpieces according to an example embodiment.

FIG. 9 illustrates a method for processing a workpiece according to an example embodiment. For the sake of clarity, the method shown in FIG. 9 will be described with regard to the multi-table system shown in FIG. 1. However, it will be understood that example embodiments may be applicable to other multi-table and/or lithography systems.

Referring to FIG. 9, at S902 a workpiece is loaded on table 110 at the loading area 108.

At S904, the table 110 is moved to the processing area 106 on the shaft 102. While moving between the loading area 108 and the processing area 106, table 110 passes table 112 as described above with regard to FIGS. 2-7, for example. In a more specific example, one of tables 110 and 112 is lifted such that the other of tables 110 and 112 passes below the lifted table.

Still referring to FIG. 9, at S906A a first workpiece loaded on table 110 is processed at the processing area 106. Concurrently or simultaneously, at S906B a second workpiece is loaded on table 112 at the loading area 108.

At S908A, after the first workpiece is processed, table 110 is moved back to the loading area 108. Concurrently or simultaneously, at S908B table 112 is moved to the processing area 106. As discussed above, while moving between the loading area 108 and the processing area 106, tables 110 and 112 pass one another as described above with regard to FIGS. 2-7, for example. In a more specific example, one of tables 110 and 112 passes is lifted such that the other table is able to pass beneath the raised table.

Still referring to FIG. 9, at S910A, the first workpiece is unloaded from the table 110 at the loading area 108. Concurrently or simultaneously, at S910B the second workpiece is processed at the processing area 106.

The method described with regard to FIG. 9 may be repeated iteratively to improve throughput of the multi-table system such that a workpiece loaded on one table may be processed concurrently or simultaneously with the loading of a workpiece on another table.

According to the example embodiment shown in FIG. 9, a time during which the first workpiece is processed at least partially overlaps a time during which the second workpiece is loaded on a table.

The foregoing description has been provided for purposes of illustration and description. It is not intended to be exhaustive. Individual elements or features of a particular example embodiment are generally not limited to that particular example, but are interchangeable where applicable and can be used in a selected embodiment, even if not specifically shown or described. The same may also be varied in many ways. Such variations are not to be regarded as a departure from example embodiments, and all such modifications are intended to be included within the scope of the example embodiments described herein.

What is claimed is:

1. A lithography processing tool comprising:
a loading area for loading a workpiece;
a processing area for processing a workpiece; and
multi-table system arranged between the loading area and the processing area, the multi-table system including at least two tables configured to pass each other while moving between the loading area and the processing area, each of the at least two tables being configured to hold a workpiece; wherein
a first of the at least two tables pivots on a shaft to raise a side of the first table such that a second of the at least two tables passes below the first table.

2. The tool of claim 1, wherein the first table is configured to be raised and lowered and the second table is configured to be at least one of raised and lowered such that the first and second tables pass each other when moving between the loading area and the processing area.

3. The tool of claim 1, wherein each of the at least two tables is mounted on a bearing providing prismatic movement along the shaft and rotational movement around the same axis.

4. The tool of claim 1, wherein the tool is a pattern generator.

5. The tool of claim 1, wherein the tool is at least one of a measurement or inspection tool.

6. The tool of claim 1, wherein the tool is a scanning multi-beam system.

7. The tool of claim 1, wherein the tool is an optical processing device including optics configured to relay image information from a modulator to the surface of the workpiece.

8. The tool of claim 1, wherein each of the at least two tables is configured to pass above or below an other of the at least two tables.

9. The tool of claim 1, further comprising:
at least a first mechanical hand configured to lift the first of the at least two tables such that the second of the at least two tables passes below the first table.

10. The tool of claim 1, wherein the multi-table system further comprises:
a first table assembly including the first of the at least two tables, the first table assembly being configured to move between the loading area and the processing area; and
a second table assembly including the second of the at least two tables, the second table assembly being configured to move between the loading area and the processing area; wherein
the first table is mounted on a first supporting part,
the second table is mounted on a second supporting part, and
the first table is configured to be raised via an actuator such that the first table passes above the second table when moving between the loading area and the processing area.

11. The tool of claim 10, wherein the first and second supporting parts pass one another at a same or substantially the same vertical height when moving between the loading area and the processing area.

12. The tool of claim 1, wherein the first of the at least two tables is mounted on a first vertically actuatable shaft and the second of the at least two tables is mounted on a second vertically actuatable shaft; and wherein
the first and second tables are configured to be raised and lowered such that one of the first and second tables passes below another of the first and second tables when moving between the loading area and the processing area.

13. The tool of claim 1, wherein the first of the at least two tables is smaller than the second of the at least two tables and the first table is configured to pass below the second table when moving between the loading area and the processing area.

14. A lithography method for processing a workpiece, the method comprising:
loading a first workpiece on a first of at least two tables;
moving the first table to a processing unit;
processing the first workpiece; and
loading a second workpiece on a second of the at least two tables; wherein
a time during which the first workpiece is processed at least partially overlaps a time during which the second workpiece is loaded, and
when moving to the processing unit, the first table pivots on a shaft to raise a side of the first table such that the second table passes below the first table.

15. The method of claim 14, further comprising:
moving the second table to the processing unit; and
moving the first table back to the loading area.

16. A pattern generator comprising:
a pattern generating unit configured to generate a pattern on a workpiece; and
a table system configured to move workpieces to and from the pattern generating unit, the table system including,
at least two tables mounted on a shaft extending between a loading area and the pattern generating unit, the at least two tables being configured to carry a workpiece, and being configured to pivot along an axis of the shaft such that a first of the at least two tables passes above or below a second of the at least two tables.

17. The pattern generator of claim 16, wherein each of the at least two tables is configured to be at least one of raised or lowered such that the at least two tables pass each other when moving between the loading area and the pattern generating unit.

18. The pattern generator of claim 16, wherein each of the at least two tables is mounted on a bearing providing prismatic movement along a shaft and rotational movement around the same axis.

* * * * *